United States Patent [19]

Naillon et al.

[11] Patent Number: 5,005,206
[45] Date of Patent: Apr. 2, 1991

[54] METHOD OF AND ARRANGEMENT FOR IMAGE DATA COMPRESSION BY MEANS OF A NEURAL NETWORK

[75] Inventors: Martine Naillon, Sceaux; Jean-Bernard Theeten, Ozoir, both of France

[73] Assignee: U.S. Philips Corporation, New York, N.Y.

[21] Appl. No.: 439,725

[22] Filed: Nov. 20, 1989

[30] Foreign Application Priority Data

Nov. 25, 1988 [FR] France ............................ 88 15427

[51] Int. Cl.$^5$ .............................................. G06K 9/46
[52] U.S. Cl. ....................................... 382/56; 382/15
[58] Field of Search ...................... 382/15, 21, 37–39, 382/56

[56] References Cited

U.S. PATENT DOCUMENTS

| | | | |
|---|---|---|---|
| 4,764,973 | 8/1988 | O'Hair | 382/15 |
| 4,802,103 | 1/1989 | Faggin et al. | 382/15 |
| 4,884,216 | 11/1989 | Kuperstein | 382/37 |

OTHER PUBLICATIONS

"Building a Hierarchy with Neural Networks: An Example-Image Vector Quantization", Applied Optics, Dec. 1, 1987, pp. 5081-5083, L. D. Jackel et al.

Primary Examiner—Stephen Brinich
Attorney, Agent, or Firm—John Francis Moran

[57] ABSTRACT

Method of and arrangement for image data compression by vector quantization in accordance with a precoding in blocks, thereafter comparing by means of a neural network precoded blocks with reference words stored in the form of a code book so as to transmit selected indices to a receiver. In accordance with the method, the neural network effects a learning phase with prescribed prototypes, thereafter with the aid of test vectors originating from the image generates an adaptive code book which is transmitted to the receiver. This adaptation utilizes attractors, which may be induced metastable states, of the neural network, and which are submitted to an optimizing procedure. The arrangement can process images with a view to their storage. It is also possible to utilize two devices which operate alternately, one device for generating the adaptive code book and the other one to utilize it with the object of processing television pictures in real time.

10 Claims, 4 Drawing Sheets

METHOD OF AND ARRANGEMENT FOR IMAGE DATA COMPRESSION BY MEANS OF A NEURAL NETWORK

BACKGROUND OF THE INVENTION

The invention relates to a method used in an arrangement for image data compression by vector quantization in accordance with a precoding in blocks constituted by a plurality of picture elements, thereafter comparing by means of a neural network precoded blocks with reference words stored in the form of a code book in the neural network so as to transmit to a receiver selected indices corresponding to the index of the reference words nearest to the precoded block.

The invention also relates to a structure for image data compression utilizing a plurality of these arrangements.

A data compression arrangement of this type is disclosed in the document "Building a heirarchy with neural networks: an example—image vector quantization" L. D. JACKEL, R. E. HOWARD, J. S. DANKER, W. HUBARD and S. A. SOLLA. Applied Optics vol. 26 no. 23 Dec. 1987 p. 5081.

This document describes the use of a neural network effecting the coding of image data by vector quantization. It relates to high-definition television pictures with the object of effecting their digital transmission in real time. Taking account of the limited capacity of transmission channels, it is necessary to effect a data compression. To that end an image is precoded in blocks, each formed from a plurality of picture elements. To limit the quantity of data to be transmitted, each block is compared with a list of reference words (relating to reference blocks) placed in a code book and in accordance with a similarity criterion, a reference word is selected from the code book, which word is nearer to the block to be encoded and of which only the index is transmitted, thus rendering it possible to find it in the list of the same code book present at the receiver end.

In accordance with this document, this word recognition operation is effected with the aid of a neural network so as to render it possible to operate at the rate necessary for the encoding of a video image. This document utilizes a fixed code book which can be drawn up beforehand. It is then not necessary to base it on multiple image configurations.

SUMMARY OF THE INVENTION

The problem to be solved is to improve the quality of the code book so as to enable an efficient encoding of almost all the image configurations to be processed, and to ensure a high intrinsic quality of image recovery.

The solution of this problem is achieved by means of a method which comprises a stage of generating an adaptive codebook by means of the neural network, the stage comprising the following steps:

A—feeding the neural network with prototypes which prescribe the states of stable neurons in the neural network which determines its synaptic coefficients associated with each prototype during the learning phases, B—resolving by means of the neural network with the aid of test vectors supplied by the picture by effecting in accordance with consecutive dynamic relaxation phases performed by feeding back the input to the output of the neural network, after which the states of the neurons are stabilized in configurations denoted attractors around which the test vectors are grouped in clouds, C—comparing each test vector with its corresponding attractor, with determination of the distance by which they are separated from each other and determination of the rate of frequentation of each attractor by the test vectors, D—determining the rough mean of all the distances:

and, when this rough mean exceeds a predetermined value, selecting attractors whose rate of frequentation exceeds a predetermined rate, thereafter determining the centre of gravity of the total cloud existing around each selected attractor to generate an optimum attractor when this attractor is the better and preserve the old attractor in the opposite case so as to form a group of new attractors which are then used again as new prototypes to restart the method of step A, and when this rough means is less than the predetermined value, to utilize all the final attractors, to form the reference words of the adaptive code book which are stored in a synaptic coefficients store of the neural network, said reference words being transmitted to the receiver to update its local code book, the method also including a coding stage utilizing the said reference words to encode the rough image and thereafter to select the indices to be transmitted.

This method can also be put into effect with the aid of a programmed calculator.

The solution is also achieved by means of an arrangement which, to put the method into effect, comprises:

a neural network provided with learning means, a memory for storing test vectors coming from the image, a memory for storing prototypes prescribing stable states to the neural network, said two memories applying their data to the neural network which, for each prescribed prototype, determines its corresponding synaptic coefficients during learning phases, thereafter performs the resolving phases with the test vector by operating in accordance with a relaxation dynamics at the end of which the stages of the neurons stabilize in configuration denoted attractors around which the test vectors are regrouped in clouds, the neural network being fed back to itself, and an adaptive circuit which compares each test vector with its corresponding attractor, which determines the distance which separates them from each other, which takes the rough mean of all the distances, (i) and when this rough mean exceeds a predetermined value, selects the attractors whose rate of appearance exceeds a predetermined rate, thereafter determines the centre of gravity of the total cloud existing around each selected attractor to generate a recentred attractor when it is the better and to preserve the old one in the opposite case so as to form a group of new attractors which are used as new prescribed prototypes in the neural network to perform at least a new adaptive cycle, (ii) and when this rough mean of all the distances is less than the predetermined value, the arrangement uses all the first attractors to form the reference words of the adaptive code book:
which are stored in the synaptic coefficients code book,
which are used in the encoding of the rough image,
which are stored in an attractor memory to be used by an indexing circuit to select the indices to be transmitted,
which are transmitted to the receiver to update the local code book.

It is also possible to provide a structure for the image data compression comprising two image compression devices for the real time processing the images of the television type, the structure further including a picture sequence counter which in the course of a given sequence adjusts one of the devices to the adaptive code book generation phase, whilst the other device is adjusted to the rough image encoding phase, thereafter performs the reverse operation in the course of the subsequent sequence.

The invention utilizes a neural network in accordance with the resolving and learning stages. A neural network is an assembly of elementary automatic devices which determine the state $V_i$ at the instant $t+1$ of an output neuron i from the states $V_j$, at the instant t, of input neurons j which are connected thereto in accordance with the synapsis by the synaptic coefficients $C_{ij}$ such as:

$$V_i(t+1) = F\left(\sum_{j=1}^{N} C_{ij} \cdot V_j(t)\right) \quad (1)$$

wherein F is a non-linear function.

The said prior-art document only puts into operation the resolving stages which consist in the determination of the states $V_i$ of all the output neurons in accordance with the preceding expression.

The invention puts inter alia learning stages into operation which consist in adapting the synaptic coefficients $C_{ij}$ to the encoding to be effected. The neural network is adjusted to a relaxation dynamics state to ensure that it converges towards stable configurations of the neural states. To that end it is fed back to itself, its output neurons becoming its input neurons. The neural network automatically converge towards stable configurations. Some of these are chosen as prototypes utilized during the generation of the code book. At the start, the prototypes (input data) are prescribed by determining the appropriate synaptic coefficients. Thereafter test vectors which are blocks selected in a random manner in the overall image to be encoded are applied to the neural network. When a test vector (states of the input neurons) is applied to the neural network, the latter evolves towards a stable state which is denoted attractor (states of the output neurons). It was moreover found that the neural network can stabilize at non-prescribed states, which in the invention are denoted induced metastables. They can also be selected to constitute attractors. The notion "metastable" relates to the degree of stability of the attractor and the notion "induced" relates to the mechanism of generating secondary attractors which proceed from the prescription of the prototypes. Thus the attractors can comprise induced metastable states at which the neural network can stabilize. Several test vectors will thus form into a cloud around each attractor. A cloud will be characterized by the attractor which gave birth to it, by the number of test vectors of the cloud and by the distance which separates each test vector from the attractor.

A first aspect to be analysed relates to that distance. To that end, when all the test vectors have been utilized, a rough mean is taken of all the distances. When the rough mean is less than a predetermined value the attractors are satisfactory and can be used as reference words of the code book.

When the rough mean exceeds the predetermined value, the attractors are not satisfactory and it is necessary to start at least a complete cycle of the method again. For that purpose a second feature relative to the frequentation of each attractor by the test vectors is considered and the rate of frequentation is determined and thereafter a certain number of attractors is selected whose rate of frequentation exceeds a predetermined rate. The total of all the attractors is nevertheless stored in an attractor memory. Thereafter the centre of gravity is determined for each cloud surrounding these selected attractors. Actually, for a given cloud, the attractor which gave birth thereto is not of necessity the optimum attractor. The determination of the centre of gravity of the cloud thus enables the old attractor, if necessary, to be replaced by an optimum attractor which better corresponds to the configuration of this cloud.

The selected attractors, which have basically been optimized are reintroduced at the beginning of a following cycle of the method as prescribed prototypes. For each prescribed prototype, the neural network, with the aid of a learning phase, determines each time the corresponding synaptic coefficients. The method can thus be repeated in several cycles until the rough mean of the distances becomes less than a predetermined value, which indicates that the final attractors obtained are satisfactory. The whole set of the population of final attractors, which is thus stored in the neural network at the end of this learning phase, then constitutes the reference words of the code book which is used by an indexing circuit to process the total image. The same neural network is thus used first for generating and thereafter for utilizing the adaptive code book.

The method can relate to the encoding of images in view of their storage in appropriate members. But preferably it relates to the encoding of high-definition television pictures with a view to effecting their digital transmission in real time. To that end two devices are used which alternately effect these two functions. Thus the adaptation can be very fast and can permit a very high quality of image recovery. Thus, also in accordance with the invention, the method generates an adaptive code book during learning and adaptation phases with the aid of a first neural network and simultaneously employs the adaptive code book generated in the preceding period of time in a second neural network.

BRIEF DESCRIPTION OF THE DRAWINGS

The invention will be better understood with reference to the accompanying Figures, which are given by way of non-limitative examples and in which.

DETAILED DESCRIPTION OF A PREFERRED EMBODIMENT OF THE INVENTION

Figure 1A:
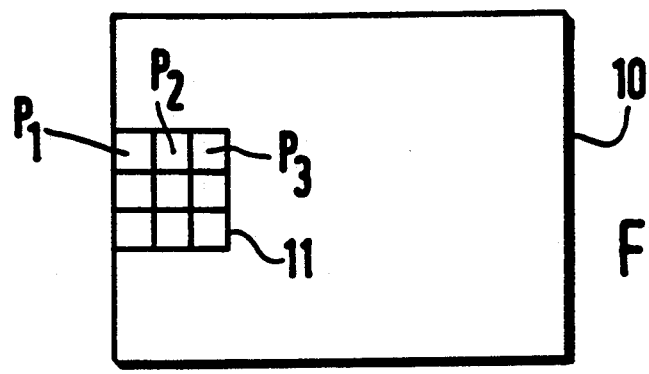
FIGS. 1A, 1B are circuit diagrams of the precoding mode of an image to be processed.
Figure 1B:
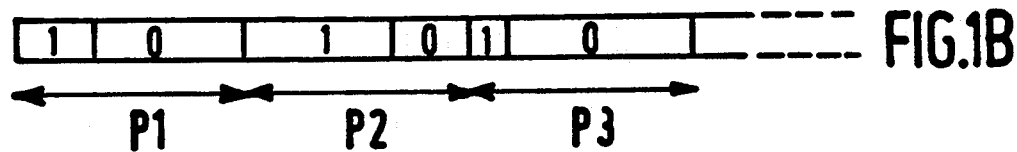

FIG. 1A shows an image 10 in which a block 11 is isolated which is formed by a plurality of picture elements such as P1, P2, P3. For the precoding of the image the whole image is thus divided into such blocks. The luminance levels of the picture elements are coded in, for example, 8 bits, that is to say 256 levels. These can be represented in accordance with a thermometical coding shown in FIG. 1B, that is to say that on a scale from 1 to 256 the level to be encoded will be represented by 1 up to the value of these levels and thereafter by the opposite value (for example −1 or 0 depending on the precoding utilized) above this value. A block is encoded by forming a vector constituted by the coding of all the picture elements comprising it. The test vectors, the prototypes and the neural states are encoded in accordance with this representation.

Figure 2:
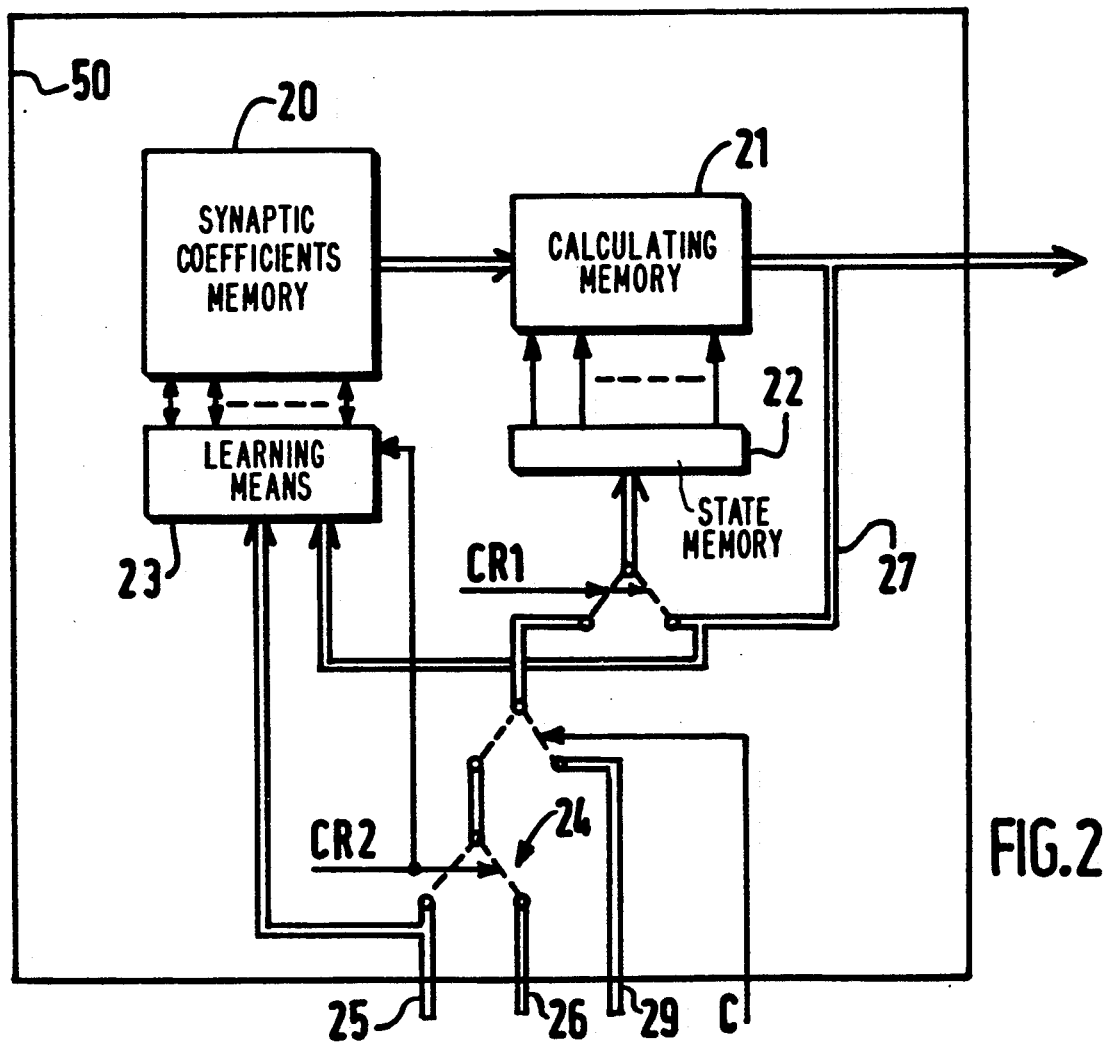
FIG. 2 is a circuit diagram of the basic members of a neural network.

FIG. 2 shows a circuit diagram of basic members of a neural network 50. It comprises a synaptic coefficients memory 20 which applies its data to a calculating member 21 which receives the states of the input neurons stored in a state memory 22. The calculating member 21 performs the calculations of the equation 1 by determining the states of the output neurons $V_i(t+1)$. The output states thus determined are fed in again at the input whilst the neural network is in the resolving phase with the test vectors for operating in accordance with a relaxation dynamics during which the neural network stabilizes at given output states denoted attractors (control signal CR1). In accordance with the learning algorithm example described hereinafter, prescribed prototypes are fed at each cycle of the method into the memory 22 and the output states of the calculating member 21 are used without applying the non-linear function F in the learning means 23, for example an intermediate calculator. This intermediate calculator again determines synaptic coefficients $C_{ij}$ by correcting them in accordance with a known leading algorithm.

Such an algorithm is, for example, the minimum recovery algorithm described in the document "Learning algorithms with optimal stability in neural networks", W. KRAUTH and M. MEZARD J. Phys. A: Math. Gen. 20 (1087) p. 745.

For all the prescribed prototypes, of the components $PR_i$, for a given index i (that is to say for a line of the matrix $C_{ij}$) the calculation (wherein N is the number of neurons):

$$S_i^{(t+1)} = \sum_{j=1}^{N} C_{ij} \cdot PR_j$$

is effected, and thereafter also the product $PR_i.S_i$ is calculated for each prescribed prototype. Thereafter the minimal value $(PR_i.S_i)_{min}$ is determined which present these products. This minimal value is compared to a predetermined value.

When $(PR_i.S_i)_{min}$ is less than the predetermined value, updating is effected of the synaptic coefficients line $C_{ij}$ having the given index i such as:

$$C_{ij}(new) = C_{ij}(old) + (1/N) \, PR_i PR_j$$

wherein $PR_i$ and $PR_j$ relate to the prescribed prototype which has given the minimal value $(PR_i.S_i)_{min}$.

When $(PR_i.S_i)_{min}$ is less than the predetermined value, the synaptic coefficients $C_{ij}$, for the given index i, are satisfactory.

Then one passes to the following index i and the same procedure is started. This algorithm is put into effect in the learning means 23.

A selector 24 allows loading the memory 22 with either the prescribed prototypes (line 25) in the learning phase, or the test vectors (line 26). The control signal CR1 allows adjusting of the neural network to a relaxation dynamic by feeding it back to itself. The control signal C allows the selection of either the code book generating mode or the code book utilizing mode for the encoding of the total picture whose data enter via the connecting line 29.

Figure 3:
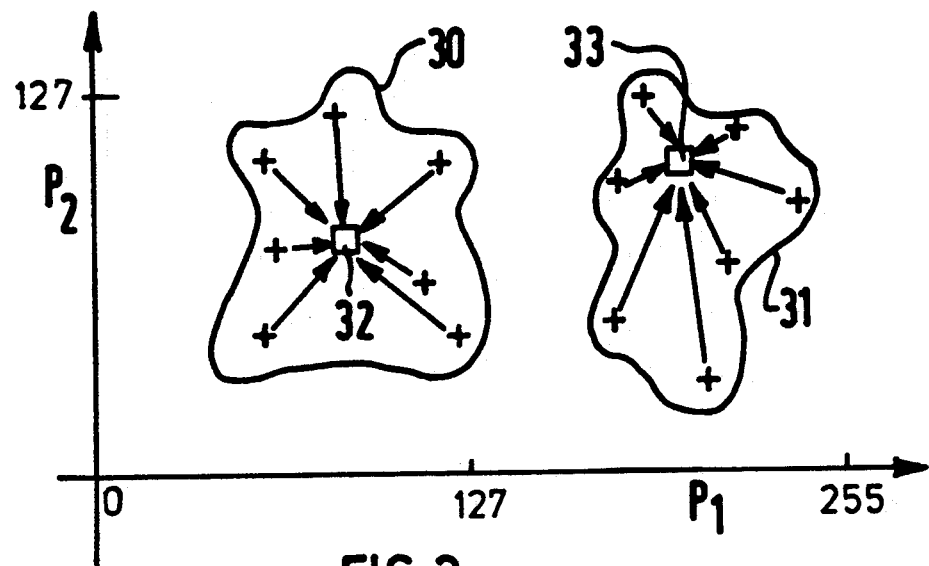
FIG. 3 shows two clouds of test vectors around two attractors.

FIG. 3 is a very simplified representation of two clouds 30, 31 of test vectors around the two attractors 32, 33, respectively, in a simple example using two picture elements, which allows a representation in a plane. In a real case in which m picture elements are used, the space has n dimensions. The cloud is characterized by its number of test vectors (consequently the rate of frequentation of the attractor) and by the distance separating each test vector from its attractor. In a first period of time the rough mean distance is determined. Two cases occur:

when this distance is less than a predetermined value the population of attractors is satisfactory and can be utilized for the generation of the adaptive code book.

when this distance exceeds a predetermined value the population of attractors is not satisfactory and it is necessary to start a cycle of the method again by modifying the number of prescribed prototypes. To that end the attractors appearing most frequently are selected and for each cloud relating thereto the attractor is prepositioned by calculating the centre of gravity of the cloud which becomes the optimum attractor. To act during following cycles of the method, a limited number of prescribed prototypes are inputed which on the basis of their rate of frequentation are selected among the optimum corrected attractors, optionally after recentring, which themselves can originate from either prescribed prototypes during the preceding cycle or from induced metastable states.

By way of a very simplified example, let it be assumed that, at the start of the first cycle, there are five prescribed prototypes PR1, PR2, PR3, PR4 and PR5. At the end of the first cycle the following situation may occur:

| LIST 1 | | converted into LIST 2 |
|---|---|---|
| PR1 | unchanged | PR1 |
| PR2 | after recentring becomes the attractor | AT1 |
| PR3 | not selected | / |
| PR4 | unchanged | PR4 |
| PR5 | after recentring becomes the attractor | AT2 |
| / | selected induced metastable state | ME1 |

During the second cycle, the list 2 is utilized to form the new prescribed prototypes. The mechanism is renewed over a plurality of cycles until the rough mean of the distances becomes less than the predetermined value. The total number of all the final attractors which were stored in the attractor memory are then utilized to constitute the reference words of the adaptive code book.

Figure 4:
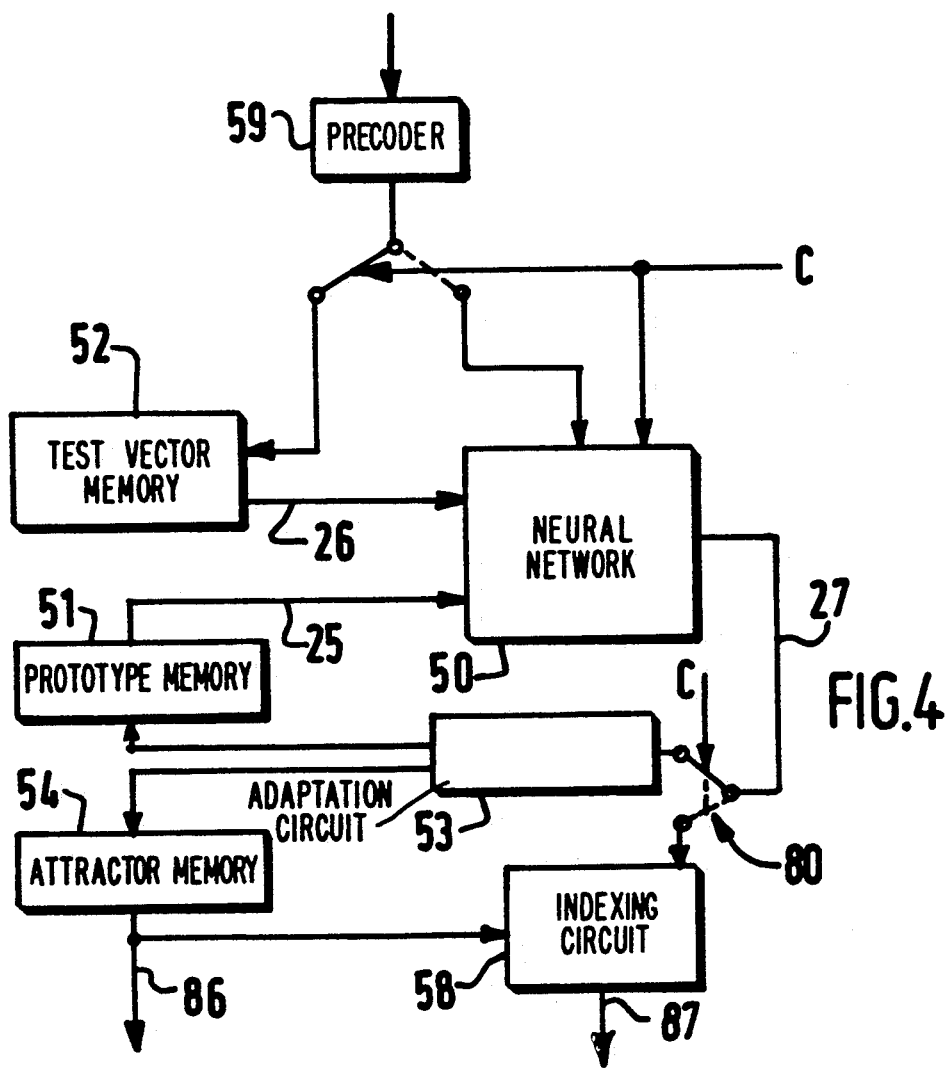
FIG. 4 is a circuit diagram of an image data compression arrangement according to the invention for encoding images to be stored.
Figure 5:
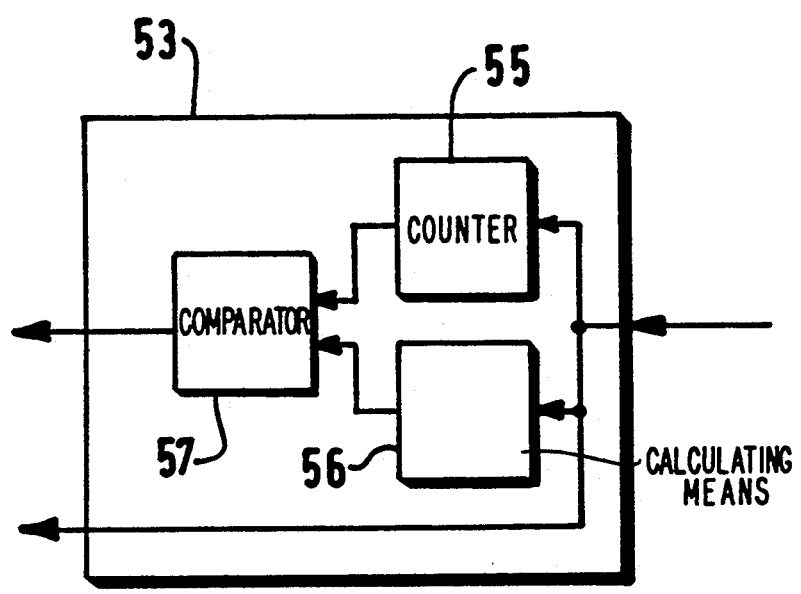
FIG. 5 is a circuit diagram of the comparison circuit.

FIG. 4 shows an image data compression arrangement according to the invention. It includes the neural network 50 described in the foregoing, which is combined with a prototype memory 51 and a test vector memory 52, which also effects the selection of the test vectors originating from the image. The states of the output neurons $V_i$ (connecting line 27) are inputed into an adaptation circuit 53 which applies all the attractors to the attractor memory 54. The prototype memory 51 receives the attractors which have been selected to constitute the new prototypes. The adaptation circuit 53 shown in FIG. 5 comprises:
- a counter 55 to determine the rates of frequentation,
- a calculating means 56 to take the rough mean of all the distances and to calculate the centres of gravity of the clouds,
- a comparator 57 for comprising:
  - the rate of frequentation with a predetermined rate,
  - the rough mean with a predetermined value.

The images are arranged in blocks of a plurality of picture elements encoded at luminance level for example in thermometical notation by a precoder 59 (FIG. 4). The attractors are read from the attractor memory 54 and entered into an indexing circuit 58 which determines the indices of the image encoded by the neural network 50 which is switched to the indexing circuit 58 via the change-over switch 80. The indices are transmitted (connecting line 87) to the receiver which also from time to time receives (connecting line 86) an updating pulse of the adaptive code book.

Figure 6:
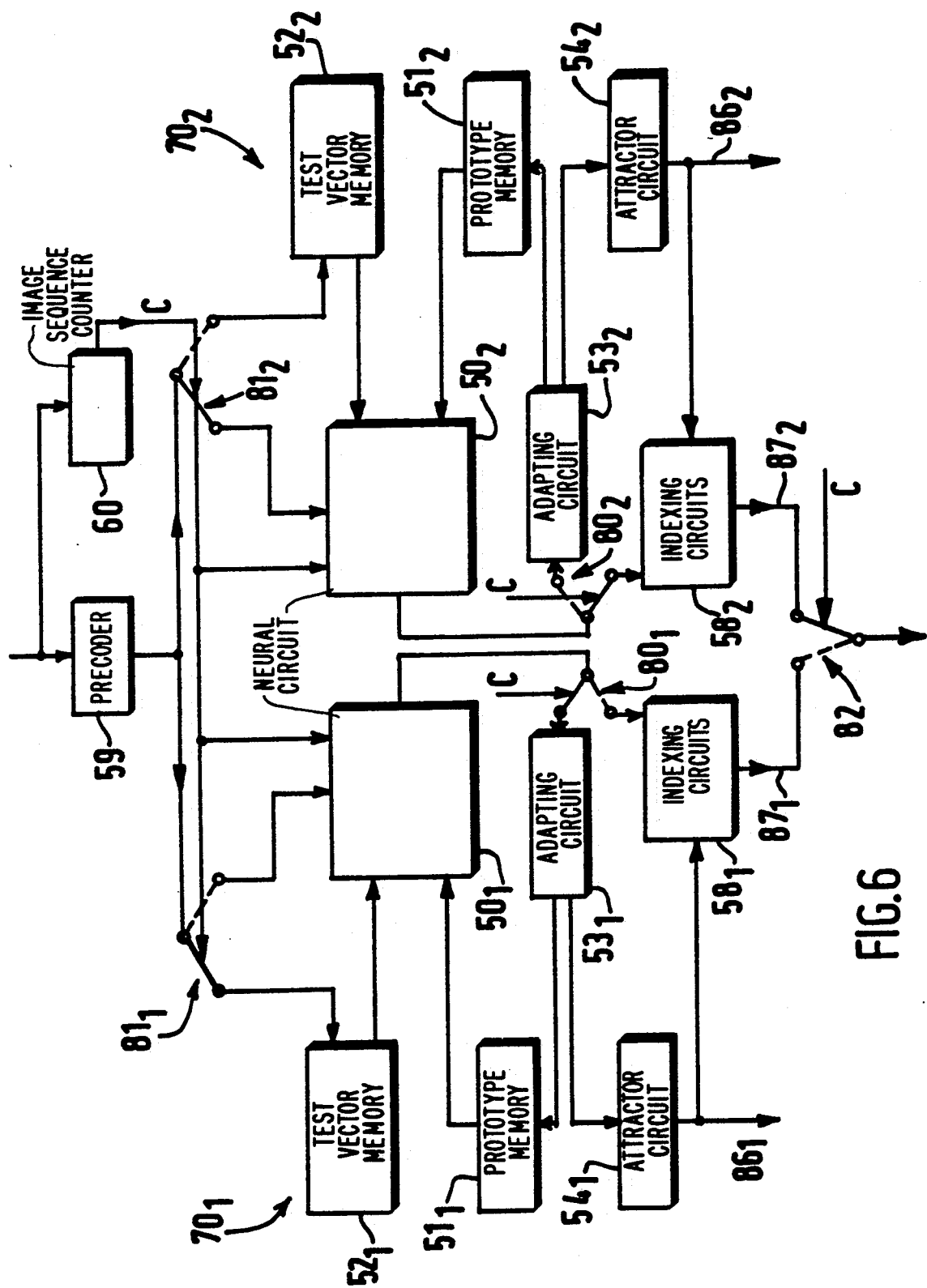
FIG. 6 is a circuit diagram of an image data compression arrangement according to the invention for encoding television pictures in real time.

FIG. 6 shows a circuit diagram of an image data compression structure in accordance with the invention for encoding television pictures in real time. It comprises two devices $70_1$, $70_2$ of the type as described in FIG. 4, each having:
- a neural circuit $50_1$, $50_2$
- a prototype memory $51_1$, $51_2$
- a test vector memory $52_1$, $52_2$
- an attractor memory $54_1$, $54_2$
- an adapting circuit $53_1$, $53_2$
- an indexing circuit $58_1$, $58_2$ The two devices operate simultaneously, one device to generate an adaptive code book and the other one to utilize the code book generated during the preceding sequence. To that end an image sequence counter 60 generates a control signal C which alternately acts on one and then on the other circuit (change-over switches $80_1$, $80_2$, $81_1$, $81_2$, 82). In a cycle, a device successively effects the learning and the adaptating phases. Simultaneously, the other device effects the successive resolving phases utilizing the code book generated during the preceding sequence. The procedure is effected inversely in the following sequence. The indices are transmitted via the connecting lines $87_1$, $87_2$ and updating of the code books is effected via the connecting lines $86_1$, $86_2$.

We claim:

1. A method used in an arrangement for image data compression by vector quantization in accordance with a precoding in blocks constituted by a plurality of picture elements, thereafter comparing by means of a neural network precoded blocks with reference words stored in the form of a code book in the neural network so as to transmit to a receiver selected indices corresponding to the index of the reference words nearest to the precoded blocks, characterized in that it includes a stage of generating an adaptive code book by means of the neural network, the stage comprising the following steps:

A—feeding the neural network with prototypes which prescribe the states of stable neurons in the neural network which determines its synaptic coefficients associated with each prototype during the learning phases, B—resolving by means of the neural network with the aid of test vectors supplied by the pictures by effecting in accordance with consecutive dynamic relaxation phases performed by feeding back the input to the output of the neural network, after which the states of the neurons are stabilized in configuration denoted attractors around which the test vectors are grouped in clouds, C—comparing each test vector with its corresponding attractor, with determination of the distance by which they are separated from each other and determination of the rate of frequentation of each attractor by the test vector, D—determining the rough mean of all the distances: and when this rough mean exceeds a predetermined value, selecting attractors whose rate of frequentation exceeds a predetermined rate, thereafter determining the centre of gravity of the total cloud existing around each selected attractor to generate an optimum attractor when this attractor is the better and preserve the old attractor in the opposite case so as to form a group of new attractors which are then used again as new prototypes to restart the method of step A, and when this rough mean is less than the predetermined value, to utilize all the final attractors, to form the reference words of the adaptive code book which are stored in a synaptic coefficients store of the neural network, said reference words being transmitted to the receiver to update its local code book, the method also including a coding stage utilizing the said reference words to encode the rough image and thereafter to select the indices to be transmitted.

2. A method as claimed in claim 1, to perform the comparison, the prototypes, the test vectors and the states of the neurons are encoded in a thermometrical notation.

3. A method as claimed in claim 1, wherein the attractors contain induced metastable states at which the neural network stabilizes.

4. A method as claimed in claim 1, wherein over a given period of time, the method generates an adaptive code book during learning and adaptation phases with the aid of a first neural network and simultaneously utilizes the adaptive code book generated in the preceding period of time in a second neural network.

5. An arrangement for image data compression by vector quantization in accordance with a precoding in blocks constituted by a plurality of picture elements, thereafter comparing by means of a neural network precoded blocks with reference words stored in the form of a code book in the neural network so as to supply selected indices corresponding to the indices of reference words which are closest to the precoded blocks, the neural network having a synaptic coefficients memory and a calculating member, characterized in that the arrangement comprises:

a neural network provided with learning means, a memory for storing test vectors coming from the image, a memory for storing prototypes prescribing stable states to the neural network, said two memories applying their data to the neural network which, for each prescribed prototype, determines its corresponding synaptic coefficients during learning phases, thereafter performs the resolving phases with the test vector by effecting in accordance with a relaxation dynamic at the end of which the states of the neurons stabilize in configuration denoted attractors around which the test vectors are regrouped into clouds, the neural network being fed back to itself, and an adaptive circuit which compares each test vector with its corresponding attractor, which determines the distance which separates them from each other, which determines the rate of frequentation of each attractor by the test vectors, which takes the rough mean of all the distances, (i) and when this rough mean exceeds a predetermined value, selects the attractors whose rate of frequentation exceeds a predetermined rate, thereafter determines the centre of gravity of the total cloud existing around each selected attractor to generate a recentred attractor when it is the better and to preserve the old one in the opposite case so as to form a group of new attractors which are used as new prescribed prototypes in the neural network to perform at least a new adaptation cycle, (ii) and when this rough mean of all the distances is less than the predetermined value, the arrangement uses all the final attractors to form the reference words of the adaptive code book:

which are stored in the synaptic coefficients code book, which are used in the encoding of the overall image, which are stored in an attractor memory to be used by an indexing circuit to select the indices to be transmitted, which are transmitted to the receiver to update the local code book.

6. A structure for the compression of image data, characterized in that it comprises two image compression devices as claimed in claim 5, so as to process television pictures in real time, the structure moreover including an image sequence counter which during a given sequence adjusts one of the devices to the adaptive code book generating phase, whilst the other device is adjusted to the overall picture encoding phase, which actions are inverted during the subsequent sequence.

7. A method as claimed in claim 2, wherein the attractors contain induced metastable states at which the neural network stabilizes.

8. A method as claimed in claim 2, wherein over a given period of time, the method generates an adaptive code book during learning and adaptation phases with the aid of a first neural network and simultaneously utilizes the adaptive code book generated in the preceding period of time in a second neural network.

9. A method as claimed in claim 3, wherein over a given period of time, the method generates an adaptive code book during learning and adaptation phases with the aid of a first neural network and simultaneously utilizes the adaptive code book generated in the preceding period of time in a second neural network.

10. A method as claimed in claim 7, wherein over a given period of time, the method generates an adaptive code book during learning and adaptation phases with the aid of a first neural network and simultaneously utilizes the adaptive code book generated in the preceding period of time in a second neural network.

* * * * *